United States Patent
Okahashi

(10) Patent No.: US 7,023,081 B2
(45) Date of Patent: Apr. 4, 2006

(54) LAND PATTERN CONFIGURATION

(75) Inventor: Tetsuhide Okahashi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/944,803

(22) Filed: Sep. 21, 2004

(65) Prior Publication Data
US 2005/0062145 A1 Mar. 24, 2005

(30) Foreign Application Priority Data
Sep. 22, 2003 (JP) ............... 2003-330107

(51) Int. Cl.
H01L 23/48 (2006.01)
H01R 12/00 (2006.01)

(52) U.S. Cl. ........................... 257/692; 439/60

(58) Field of Classification Search ........... 257/692; 174/261; 439/60
See application file for complete search history.

(56) References Cited

U.S. PATENT DOCUMENTS

| 5,834,832 A | * | 11/1998 | Kweon et al. ............ 257/676 |
| 5,966,020 A | * | 10/1999 | Rampone et al. ........... 324/755 |
| 6,347,950 B1 | * | 2/2002 | Yokoyama et al. ......... 439/248 |
| 6,403,895 B1 | * | 6/2002 | Sota .......................... 174/260 |

FOREIGN PATENT DOCUMENTS

| JP | 6-140814 A | * | 5/1994 |
| JP | 6-188656 A |   | 7/1994 |

* cited by examiner

Primary Examiner—W. David Coleman
Assistant Examiner—Lex H. Malsawma
(74) Attorney, Agent, or Firm—Birch, Stewart, Kolasch & Birch, LLP

(57) ABSTRACT

The pin pitches on the respective edges of a plurality of selectively mounted semiconductor devices match one another, and the distances between the edges differ from one another. Shared lands are arranged so as to correspond to contact pins disposed on one edge of the respective semiconductor devices. Accordingly, selectively mounting a plurality of types of semiconductor devices onto a printed circuit board is achieved while saving space.

5 Claims, 6 Drawing Sheets (a)

(b)

(a)

(b)

(a)

(b)

LAND PATTERN CONFIGURATION

BACKGROUND OF THE INVENTION

In accordance with U.S. Patent Law Section 119(a), the present application claims priority upon Japanese Patent Application No. 2003-330107 filed on Sep. 22, 2003, the entire disclosure of which is herein incorporated by reference.

The present invention relates to a layout configuration for lands (land pattern configuration), which is formed on a printed circuit board for mounting ICs and other semiconductor devices onto this printed circuit board. More particularly, the present invention relates to an improvement for selectively mounting a plurality of types of semiconductor devices (IC chips and so forth) onto the same printed circuit board, while saving space. Furthermore, in this specification, the respective contact pin terminal areas formed on a printed circuit board (one terminal area for connecting one contact pin) are called "lands", and arrays, which are aggregates of these lands, are called "land patterns".

Conventionally, various types of ICs, such as power ICs and switching ICs, have been mounted onto a printed circuit board for use in a LNB (Low Noise Block Down Converter), which is connected, for example, to a satellite transceiving antenna. For example, JP H6-140814A and JP H6-188656A disclose constitutions in which a microwave IC is mounted onto a LNB printed circuit board.

Often, there are a plurality of types of candidates for ICs to be employed in the development stage of this type of printed circuit board and semiconductor device, and the procedure adopted calls for deciding the ICs to be employed (to be used as a product) after subjecting these ICs to evaluation testing. Further, in most cases, as a rule, the least expensive IC is employed in an attempt to hold down costs, but when the performance of this IC is unsatisfactory, there are also cases in which another candidate IC or the same kind of IC as in the past is used.

Thus, in the development stage for deciding the ICs to be mounted onto a printed circuit board, it is necessary to selectively mount a plurality of types of ICs (ICs for which the numbers of contact pins differ) onto a printed circuit board. For this reason, in the past it was necessary to prepare a plurality of types of printed circuit boards corresponding to the respective ICs (candidate ICs). Further, in order to enable selective mounting of a plurality of types of ICs onto the same printed circuit board, there was also the approach of individually disposing the mounting areas of a number of ICs on a single printed circuit board, and forming land patterns that correspond to the respective contact pins of each IC.

However, when a printed circuit board is prepared for each candidate IC as explained hereinabove, it is necessary to also manufacture printed circuit boards that ultimately are not used, leading to increased development costs.

Also, when individual land patterns corresponding to the contact pins of each IC are formed in advance on one printed circuit board, this can readily be achieved if the printed circuit board is relatively large, but in line with making semiconductor products smaller in recent years, printed circuit boards have also had to be made smaller, making it impossible for the individual land patterns of each IC to be formed in advance on this small printed circuit board.

The present invention was devised with this point in mind, and has as an object the provision of a land pattern configuration that makes selectively mounting a plurality of types of semiconductor devices onto the same printed circuit board achievable in as little space as possible.

SUMMARY OF THE INVENTION

The solution provided by the present invention is as follows. Firstly, to enable a plurality of types of semiconductor devices comprising contact pins to be selectively mounted onto a printed circuit board, a land pattern configuration is disposed onto this printed circuit board, and at least one of a plurality of lands is arranged as a shared land corresponding to the contact pins of a plurality of types of semiconductor devices. Accordingly, the constitution is such that when any of these semiconductor devices is mounted, at least one contact pin of these respective semiconductor devices is connected to a shared land.

In accordance with this feature, it is not necessary to provide lands corresponding individually to all the contact pins of all the semiconductor devices that are to be used, and it also becomes possible to mutually superpose the mounting positions of the respective semiconductor devices. Thus, selectively mounting a plurality of types of semiconductor devices onto a printed circuit board can be achieved while saving space.

The following can be given as an even more specific constitution. Firstly, each semiconductor device comprises a plurality of contact pins on edges that are opposite one another, and while the pitches of the adjacent contact pins on the respective edges of the semiconductor devices match one another, the distances between the edges differ from one another among the semiconductor devices. A shared land is arranged so as to correspond to at least one of the contact pins provided on one edge of each semiconductor device. In accordance with this feature as well, selectively mounting a plurality of types of semiconductor devices onto a printed circuit board can be achieved while saving space, similar to the case of the above-described solution.

Further, as another land pattern configuration, each semiconductor device comprises a plurality of contact pins on edges that are opposite one another, and the pitches of the adjacent contact pins on each of the edges match one another among the semiconductor devices, the distances between the edges differ from one another among the semiconductor devices. The shared land is arranged so as to correspond to at least one of the contact pins provided on one edge of each semiconductor device. Also, conduction is provided among dedicated lands individually arranged so as to correspond to the respective contact pins comprising the other edge of each of the semiconductor devices.

In accordance with this feature, the interconnects for dedicated lands corresponding only to the contact pins of one semiconductor device and the dedicated lands corresponding only to the contact pins of another semiconductor device can be shared inside the printed circuit board, making it possible to simplify the interconnect configuration inside the printed circuit board, and to reduce the size and streamline the fabrication work of the printed circuit board.

In addition, as another configuration for a land pattern, each semiconductor device comprises a row of contact pins made up of a plurality of contact pins on edges that are opposite one another, and the pitches of the adjacent contact pins on each of the edges of the semiconductor devices match one another among the semiconductor devices, and the distances between the edges also match one another among the semiconductor devices, portions of the pin layouts differ from one another among the semiconductor devices. Then, at least the lands positioned in the middle of the rows of lands arranged so as to parallel the rows of contact pins of each semiconductor device are arranged as shared lands. In accordance with this feature as well, selectively mounting a plurality of types of semiconductor devices onto a printed circuit board can be achieved while saving spaces similar to the case of the above-described solution.

Further, it is also possible to arrange a shared land such that it corresponds to the contact pins of three or more types of semiconductor devices. More specifically, at least one land of a plurality of lands may be arranged as a shared land corresponding to the contact pins of three or more types of semiconductor devices. Then, the constitution is such that when any of these semiconductor devices is mounted onto a printed circuit board, at least one contact pin of these respective semiconductor devices is connected to the shared land.

As described hereinabove, in the present invention, when any semiconductor device of a plurality of types of semiconductor devices is mounted onto a printed circuit board, a land pattern configuration comprises a shared land to which at least one contact pin of these respective semiconductor devices is connected. Thus, selectively mounting a plurality of types of semiconductor devices onto a printed circuit board can be achieved while saving space, development costs can be reduced, and semiconductor products can be made smaller in line with decreasing the size of the printed circuit board.

DESCRIPTION OF THE PREFERRED EMBODIMENTS

Embodiments of the present invention will be explained hereinbelow on the basis of the figures. In the present embodiment, a case in which one microwave IC is decided upon from among a plurality of candidates as the IC to be mounted onto a printed circuit board for an LNB connected to a broadcast satellite receiving antenna will be explained.

This type of microwave IC comprises a variety of pins as contact pins (connection terminals), such as a high-frequency signal input pin, dielectric resonator contact pin, intermediate frequency output pin, bias pin, and ground pin. Now, a first and second embodiment to be explained hereinbelow will be explained with an example in which a decision is made to utilize one of the following two types of ICs (first IC, second IC).

Figure 1:
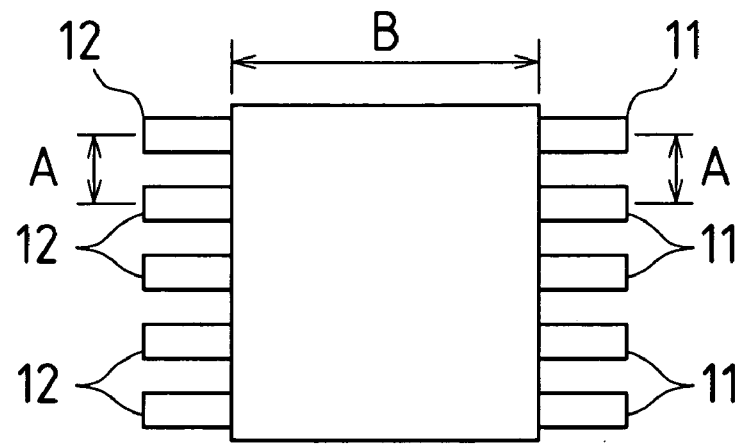
FIG. 1(*a*) is a plan view showing a first IC, and FIG. 1(*b*) is a plan view showing a second IC.
Figure 1:
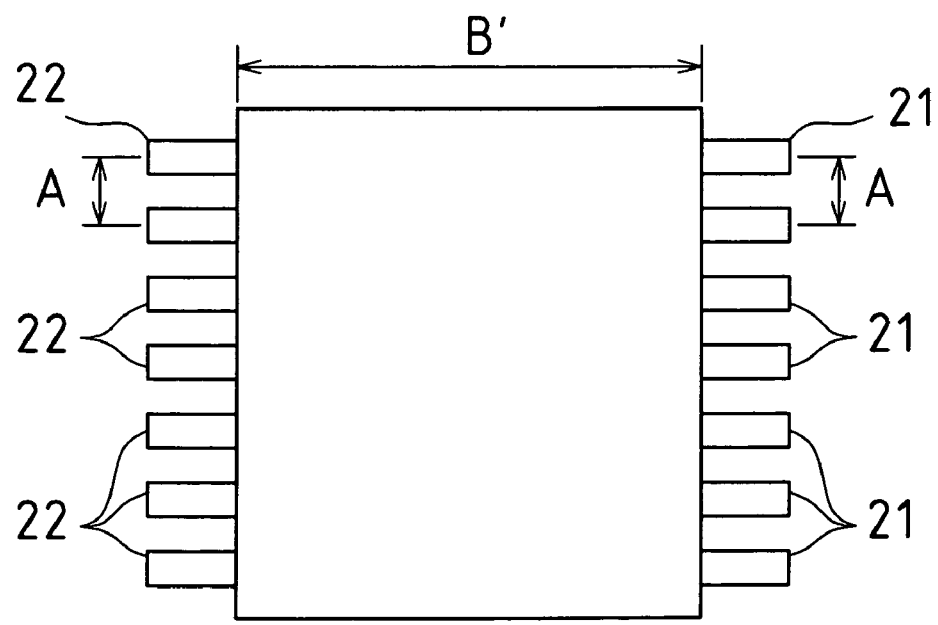

FIG. 1(*a*) is a plan view showing a first IC 1, and FIG. 1(*b*) is a plan view showing a second IC 2, respectively. The first IC 1 is smaller than the second IC 2, and five contact pins each 11, 11, . . . , 12, 12, . . . are provided protruding from opposite edges, constituting respective rows of contact pins. The pitch (pin pitch) of the contact pins 11, 11, . . . , (12, 12, . . .) provided protruding from the same edge is dimension A in the figure. Further, the length of the edges from which contact pins are not protruding is dimension B in the figure. In other words, the pitch (pin pitch) between the opposite edges is dimension B in the figure.

Meanwhile, the second IC 2 is larger than the first IC 1, and seven contact pins each 21, 21, . . . , 22, 22, . . . are provided protruding from opposite edges, constituting respective rows of contact pins. The pitch (pin pitch) of the contact pins 21, 21, . . . , (22, 22, . . .) provided protruding from the same edge is dimension A in the figure (the same as in the first IC 1). Further, the length of the edges from which contact pins are not protruding is dimension B' in the figure. In other words, the pitch (pin pitch) between the opposite edges is dimension B' in the figure, and this is larger than the dimension (B) in the first IC 1.

A land pattern on a printed circuit board to which these two types of ICs 1, 2 can be selectively mounted will be explained hereinbelow. In the figures, lands (lands not connected to contact pins) are indicated by diagonal lines.

First Embodiment

Figure 2:
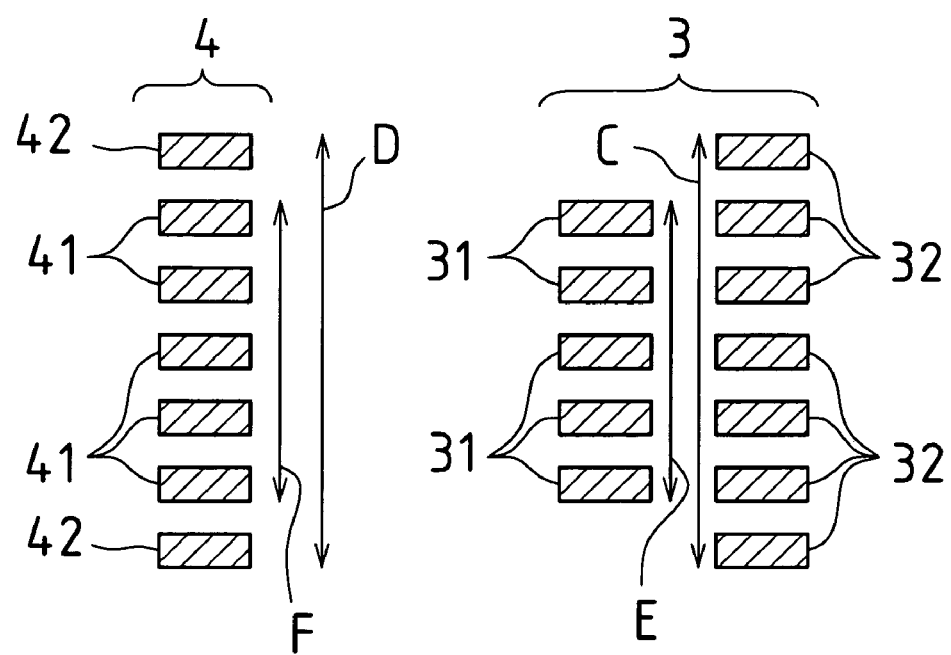
FIG. 2 is a diagram showing a land pattern according to a first embodiment.

A land pattern configuration of a first embodiment will be explained first. FIG. 2 shows land patterns for this embodiment. A first land pattern group 3 positioned on the right side in the figure (the one side) comprises five inside lands 31, 31, . . . (with pin pitch A) corresponding to the contact pins 11, 11, . . . provided protruding from the right edge (the one side) of the first IC 1, and seven outside lands 32, 32, . . . (with pin pitch A) corresponding to the contact pins 21, 21, . . . provided protruding from the right edge (the one side) of the second IC 2, and each constitutes a row of lands. The respective 5 inside lands 31, 31, . . . are arranged in positions facing the five lands toward the middle of the seven outside lands 32, 32, . . .

Meanwhile, a second land pattern group 4 positioned on the left side (the other side) in the figure comprises seven lands 41, 41, . . . , 42, 42 (with pin pitch A) corresponding to the contact pins 22, 22, . . . provided protruding from the left edge (the other side) of the second IC 2, constituting a row of lands. The two lands of these seven lands 41, 41, . . . , 42, 42 positioned on the outer sides of the row of lands (the outer sides in the vertical direction (direction of the land pattern array) in FIG. 2) are dedicated lands 42, 42 for a portion of the contact pins 22, 22 of the second IC 2, and the five lands on the inner side are shared lands 41, 41, . . . These features will be explained below.

Now, since the pitch of the contact pins protruding from the same edge of the first IC 1 is dimension A and the pitch of the contact pins protruding from the same edge of the second IC 2 is dimension A, when mounting the second IC 2, all of the lands (shared lands and dedicated lands) 41, 41, . . . , 42, 42 of the seven lands 41, 41, . . . , 42, 42 in the second land pattern group 4 are utilized, and the contact pins 22, 22, . . . provided protruding from this second IC 2 are connected. Conversely, when mounting the first IC 1, the five shared lands in the middle of the seven lands 41, 41, . . . , 42, 42 in the second land pattern group 4 are utilized, and the contact pins 12, 12, . . . provided protruding from this first IC 1 are connected.

Figure 3:
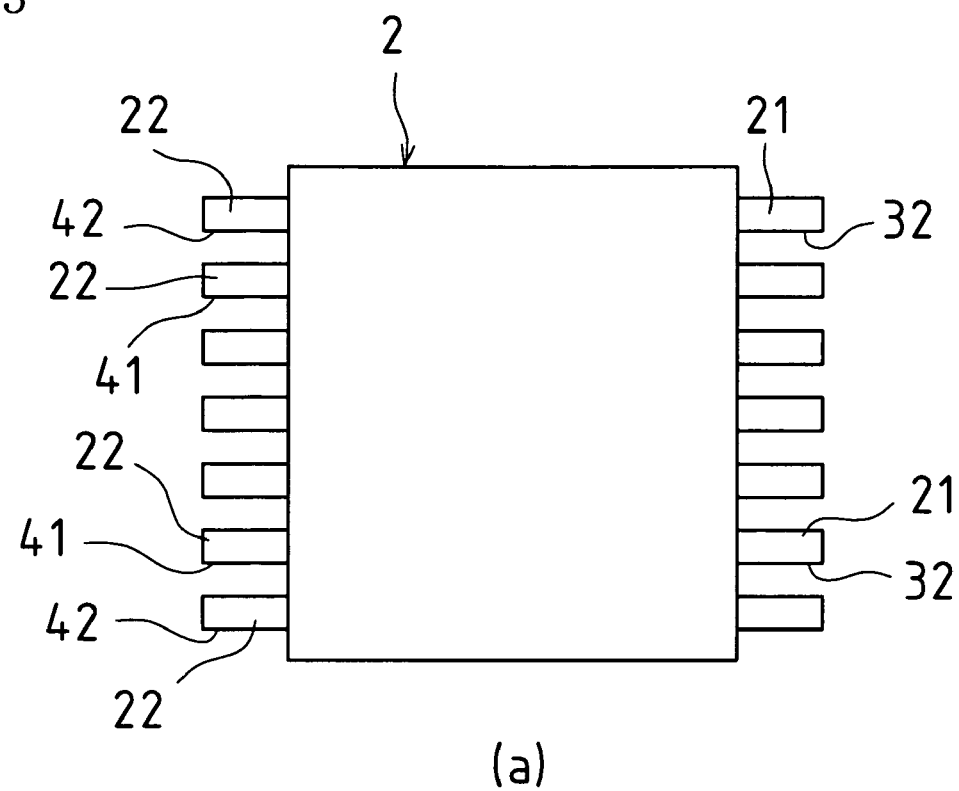
FIG. 3(*a*) is a plan view showing the mounted state of the second IC, and FIG. 3(*b*) is a plan view showing the mounted state of the first IC.
Figure 3:
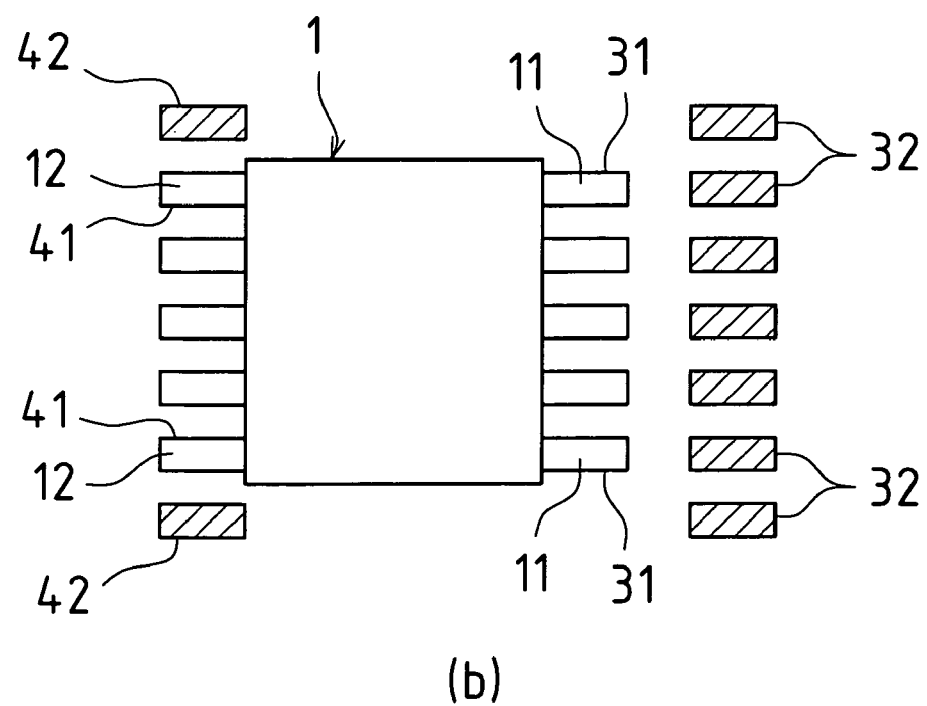

FIG. 3(*a*) is a plan view showing the mounted state of the second IC 2, and FIG. 3(*b*) is a plan view showing the mounted state of the first IC 1. Thus, in the mounted state of the second IC 2, the contact pins 21, 21, . . . , 22, 22, . . . of this second IC 2 are connected to all of the outside lands 32, 32, ... of the first land pattern group 3 and all of the lands (shared lands 41, 41, ... and dedicated lands 42, 42) of the second land pattern group 4. In other words, in the mounted state of this second IC 2, all of the regions of the land terminal areas C, D in FIG. 2 are utilized.

Conversely, in the mounted state of the first IC 1, the contact pins 11, 11, ..., 12, 12, ... of this first IC 1 are connected to all of the inside lands 31, 31, ... of the first land pattern group 3 and to the inside five shared lands 41, 41, ... of the second land pattern group 4. In other words, in the mounted state of this first IC 1, only the regions of land terminal areas E, F in FIG. 2 are utilized.

The present embodiment is constituted such that the ICs to be employed (employed as products) are determined after subjecting the ICs to evaluation testing while alternately mounting two types of ICs 1, 2 onto the same printed circuit board in this manner.

As described hereinabove, in the present embodiment, the land pattern for selectively mounting a first IC 1 comprising 10 contact pins and a second IC 2 comprising 14 contact pins can be made to comprise only 19 lands 31, 32, 41, 42 ... without the need for providing lands (24 lands) corresponding individually to all the contact pins. Further, the mounting positions of the first IC 1 and the second IC 2 overlap one another, doing away with the need to individually ensure mounting spaces for these ICs. Thus, selectively mounting a plurality of types of semiconductor devices is achievable while saving space.

Second Embodiment

Next, a land pattern configuration of a second embodiment will be explained. Only those points that differ from the first embodiment described hereinabove will be explained here.

Figure 4:
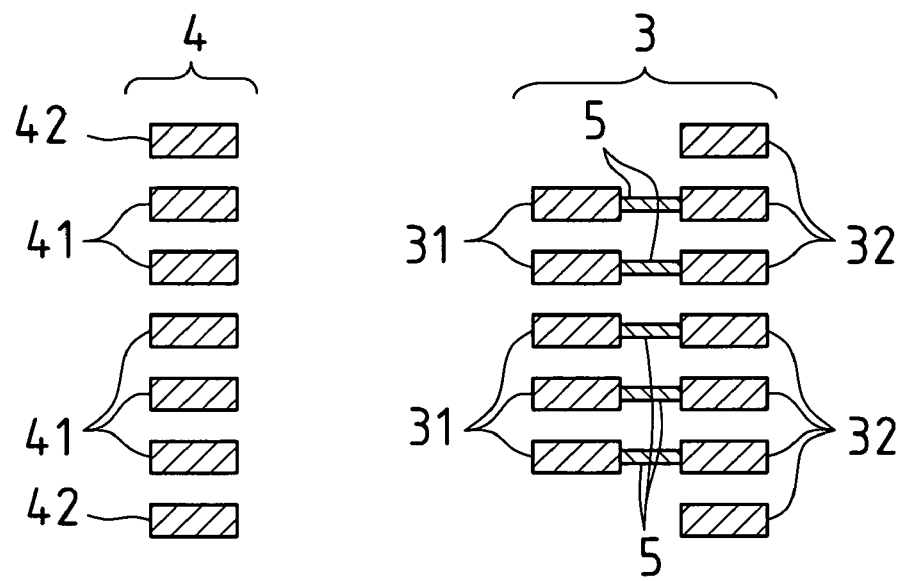
FIG. 4 is a diagram showing a land pattern according to a second embodiment.

FIG. 4 shows a land pattern of the present embodiment. A first land pattern group 3 positioned on the right side of the figure comprises five inside lands 31, 31, ... corresponding to the contact pins 11, 11, ... provided protruding from the right edge of the first IC 1, and seven outside lands 32, 32, ... corresponding to contact pins 21, 21, ... provided protruding from the right edge of the second IC 2.

The inside lands 31, 31, ... are connected to the outside lands 32, 32, ... opposite them by conductive materials 5, 5, ... (for example, solder or a film of deposited metal). Furthermore, a second land pattern group 4 positioned on the left side of the figure is the same as that of the first embodiment described hereinabove.

Figure 5:
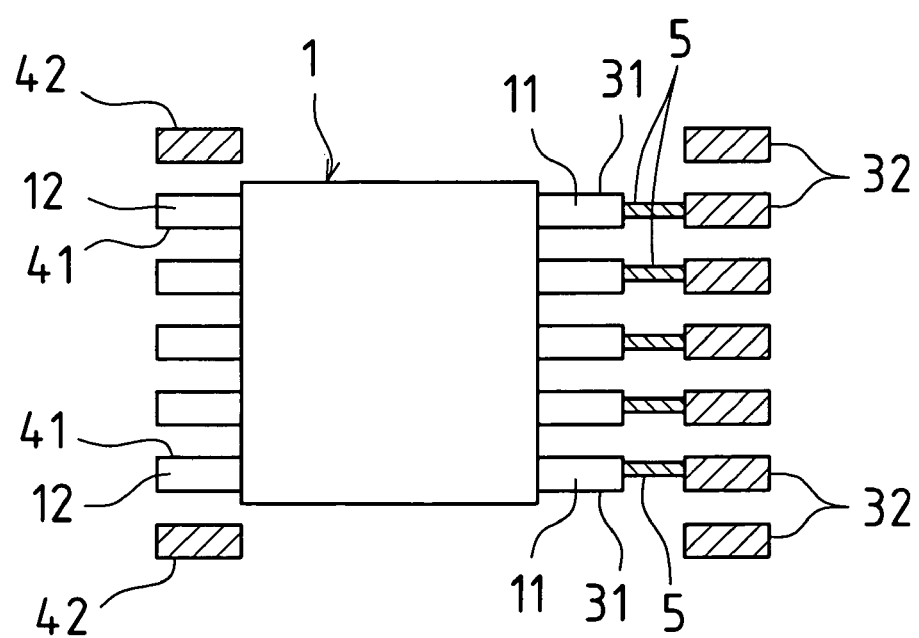
FIG. 5 is a plan view showing the mounted state of the first IC in the second embodiment.

FIG. 5 is a plan view showing the mounted state of a first IC 1. Thus, in the mounted state of the first IC 1, the contact pins 11, 11, ... of this first IC 1 are connected to the outside lands 32, 32, ... from all of the inside lands 31, 31, ... of the first land pattern group 3 via a conductive material 5, 5 ...

According to the constitution of the present embodiment, in addition to the effects of the first embodiment described hereinabove, the interconnects for the inside lands 31, 31, ... and outside lands 32, 32, ... can be shared, making possible the simplification of the interconnect configuration inside the printed circuit board.

Third Embodiment

Figure 7:
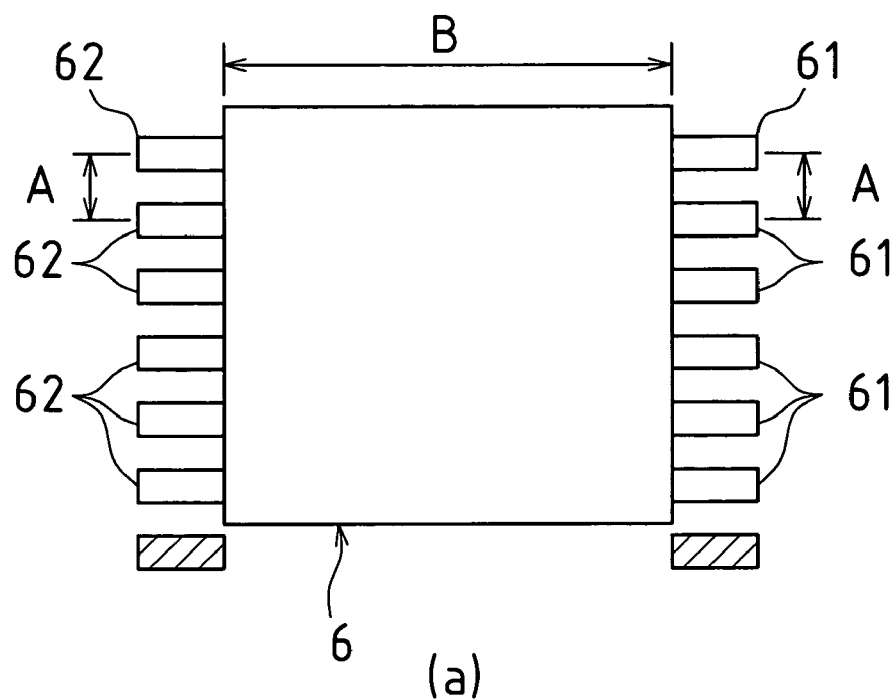
FIG. 7(*a*) is a plan view showing the mounted state of a third IC, and FIG. 7(*b*) is a plan view showing the mounted state of a fourth IC.
Figure 7:
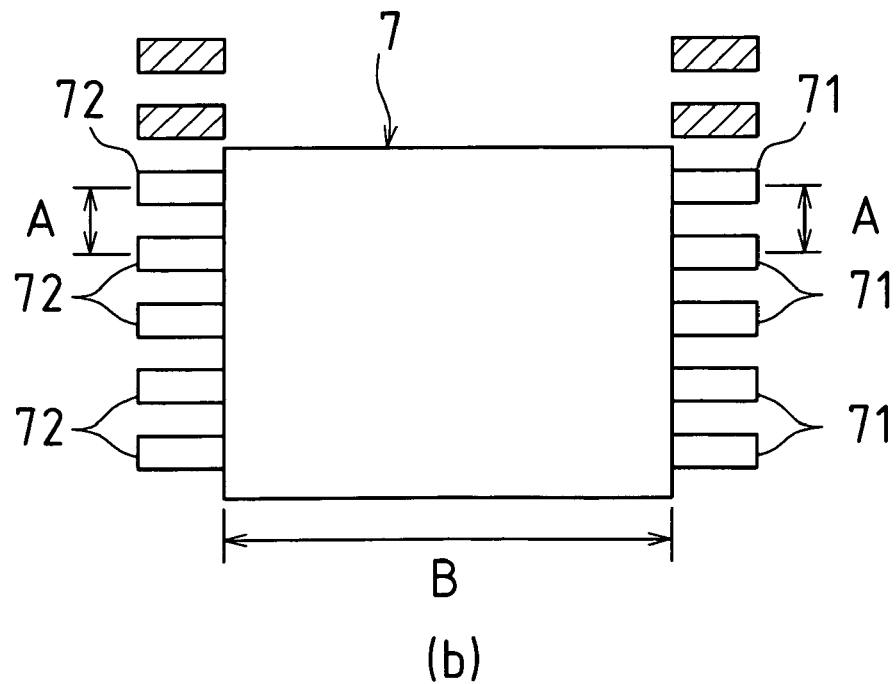

Next, a land pattern configuration of the third embodiment will be explained. Only those points that differ from the first embodiment described hereinabove will be explained here. As for the two types of ICs that are the objects of the present embodiment, as shown in FIGS. 7(*a*), (*b*), the lengths of the edges (dimension B in the figure) from which contact pins are not protruding are the same, the lengths of the edges from which contact pins are protruding differ from one another, six contact pins each 61, 61, ..., 62, 62, ... are provided protruding from the edges of the one IC (third IC 6), and five contact pins each 71, 71, ..., 72, 72, ... are provided protruding from the edges of the other IC (fourth IC 7). Also, the pitch of the contact pins (pin pitch) protruding from the same edges is the same in both ICs 6, 7 (dimension A in the figure).

Figure 6:
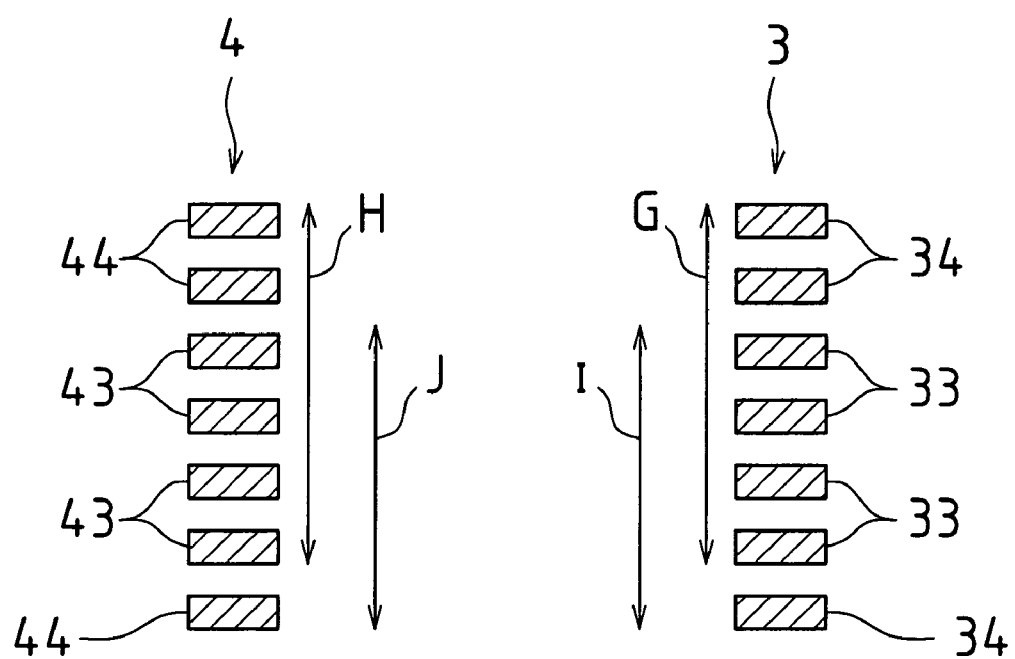
FIG. 6 is a plan view showing a land pattern according to a third embodiment.

FIG. 6 shows a land pattern of the present embodiment. A first land pattern group 3, which is positioned in the right side of the figure, and a second land pattern group 4, which is positioned in the left side of the figure, both comprise seven lands 33, 34, 43, 44 ...

The four lands in the middle of the respective land pattern groups 3, 4 constitute shared lands 33, 33, 43, 43. More specifically, the respective upper two lands in the land pattern groups 3, 4 of FIG. 6 are dedicated lands 34, 34, 44, 44 for the third IC 6 from which six contact pins protrude on each side, and the respective lower single lands are dedicated lands 34, 44 for the fourth IC 7 from which five contact pins protrude on each side. The other leads 33, 33, ... 43, 43 ... are shared leads.

FIG. 7(*a*) is a plan view showing the mounted state of the third IC 6, and FIG. 7(*b*) is a plan view showing the mounted state of the fourth IC 7. Thus, the mounted state of the third IC 6 is such that the contact pins 61, 62 of the IC are connected to six lands each of the land pattern groups 3, 4 in the upper part of the figure (the shared lands 33, 43 and dedicated lands 34, 44). In other words, in the mounted state of this third IC 6, only the regions of land terminal areas G, H in FIG. 6 are used.

Conversely, the mounted state of the fourth IC 7 is such that the contact pins 71, 72 of the IC are connected to five lands each of the land pattern groups 3, 4 in the bottom part of the figure (the shared lands 33, 43 and dedicated lands 34, 44). In other words, in the mounted state of this fourth IC 7, only the regions of land terminal areas I, J in FIG. 6 are used.

In the constitution of the present embodiment as well, the land pattern for selectively mounting a third IC 6 comprising 12 contact pins and a fourth IC 7 comprising 10 contact pins can be made to comprise only 14 lands without the need for providing lands (22 lands) corresponding individually to all the contact pins, as in the first embodiment. Further, the mounting positions of the third IC 6 and the fourth IC 7 overlap for the most part, doing away with the need to individually ensure mounting spaces for these ICs 6 and 7. Thus, selectively mounting a plurality of types of semiconductor devices is achievable while saving space.

OTHER EMBODIMENTS

The embodiments explained hereinabove were explained for cases wherein microwave ICs are mounted onto an LNB printed circuit board. The present invention is not limited to this, and can also be applied to cases in which other semiconductor devices are mounted onto a printed circuit board.

Further, for the above-described embodiments, explanations were given for cases in which one of two types of IC candidates was decided upon, but the present invention can also be applied to cases in which one of three or more IC candidates is decided upon. In this case, it is not absolutely necessary for shared lands to be shared by all of the three or more types of ICs, but they should be shared by at least two types of ICs. That is, the constitution should be such that no matter which of two types of ICs is mounted, it is mounted onto the printed circuit board in a state wherein the contact pins of at least one of these ICs are connected to shared lands.

The present invention can be practiced in various other forms without departing from the sprit or essential characteristics thereof. Therefore, the above embodiments were described in all respects by way of example only and should not be construed as limiting. The scope of the present invention is defined by the appended claims, and is by no means restricted to the text of the specification. Furthermore, all the alterations or modifications covered by the scope of the claims and equivalents thereof fall within the scope of the present invention.

What is claimed is:

1. A land pattern configuration disposed on a printed circuit board for enabling a plurality of types of semiconductor devices comprising contact pins to be selectively mounted onto the printed circuit board, the land pattern configuration comprising:
    a plurality of lands,
    wherein at least one of the plurality of lands is arranged as a shared land corresponding to contact pins of the plurality of types of semiconductor devices, and at least one contact pin of these semiconductor devices is connected to the shared land when any of these semiconductor devices is mounted.

2. The land pattern configuration according to claim 1, wherein the semiconductor devices each comprise a plurality of contact pins on edges that are opposite one another, and the pitches of adjacent contact pins on each of the edges match one another among the semiconductor devices, whereas the distances between the edges differ from one another among the semiconductor devices; and
    the shared land is arranged so as to correspond to at least one contact pin disposed on one edge of the semiconductor devices.

3. The land pattern configuration according to claim 1, wherein the semiconductor devices each comprise a plurality of contact pins on edges that are opposite one another, respectively, and the pitches of adjacent contact pins on each of the edges match one another among the semiconductor devices, the distances between the edges differ from one another among the semiconductor devices;
    the shared land is arranged so as to correspond to at least one contact pin disposed on one edge of the semiconductor devices; and
    conduction is provided among dedicated lands, which are individually arranged corresponding to the respective contact pins disposed on the other edge of the semiconductor devices.

4. The land pattern configuration according to claim 1, wherein the semiconductor devices each comprise rows of contact pins made up of a plurality of contact pins on edges that are opposite one another, the pitches of adjacent contact pins on each of the edges match one another among the semiconductor devices, and the distances between the edges match one another among the semiconductor devices, whereas the numbers of contact pins differ from one another among the semiconductor devices; and
    at least the lands positioned in the middle of the rows of lands, which are arranged so as to parallel the rows of contact pins of the semiconductor devices, are arranged as shared lands.

5. The land pattern configuration according to any one of claims 1 through 4,
    wherein at least one of the plurality of lands is arranged as a shared land corresponding to contact pins of three or more types of semiconductor devices, and at least one contact pin of these semiconductor devices is connected to the shared land when any of these semiconductor devices is mounted.

* * * * *